United States Patent
Yonemura et al.

(10) Patent No.: US 8,616,682 B2
(45) Date of Patent: Dec. 31, 2013

(54) LIQUID EJECTION HEAD

(75) Inventors: Takayuki Yonemura, Suwa (JP); Hiromu Miyazawa, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 100 days.

(21) Appl. No.: 13/046,671

(22) Filed: Mar. 11, 2011

(65) Prior Publication Data

US 2011/0221831 A1 Sep. 15, 2011

(30) Foreign Application Priority Data

Mar. 12, 2010 (JP) ................................. 2010-056806
May 28, 2010 (JP) ................................. 2010-122800

(51) Int. Cl.
*H01L 41/00* (2013.01)
*H02N 2/00* (2006.01)
*B41J 2/045* (2006.01)

(52) U.S. Cl.
USPC ........................................... 347/68; 310/311

(58) Field of Classification Search
None
See application file for complete search history.

(56) References Cited

U.S. PATENT DOCUMENTS

| | | | |
|---|---|---|---|
| 2008/0111452 A1* | 5/2008 | Koizumi et al. | 310/324 |
| 2010/0192842 A1 | 8/2010 | Sasaki et al. | |
| 2011/0012051 A1* | 1/2011 | Kaigawa et al. | 252/62.9 R |
| 2011/0102514 A1 | 5/2011 | Yonemura | |
| 2011/0102517 A1 | 5/2011 | Yonemura et al. | |
| 2011/0102518 A1 | 5/2011 | Yonemura et al. | |

FOREIGN PATENT DOCUMENTS

| | | | |
|---|---|---|---|
| JP | 2001-223404 A | | 8/2001 |
| JP | 2009252789 A | * | 10/2009 |
| JP | 2009/267363 A | | 11/2009 |
| JP | 2009-267364 A | | 11/2009 |
| JP | 2009-287066 A | | 12/2009 |

OTHER PUBLICATIONS

Zhang, Preparation, structures, and multiferroic properties of single phase Bi1-xLaxFeO3, Apr. 19, 2006, Journal of Applied Physics 100, 114108 (2006).*

* cited by examiner

*Primary Examiner* — Matthew Luu
*Assistant Examiner* — Erica Lin
(74) *Attorney, Agent, or Firm* — Kilpatrick Townsend & Stockton LLP

(57) ABSTRACT

A liquid ejection head, comprises a pressure generation chamber communicating with a nozzle opening and a piezoelectric element having a piezoelectric layer and an electrodes. The piezoelectric layer is a perovskite type complex oxide containing bismuth, iron, and cerium. The piezoelectric layer contains the cerium in a proportion of 0.01 molar ratio or more and 0.13 molar ratio or lower based on the total amount of the bismuth and the cerium.

6 Claims, 18 Drawing Sheets

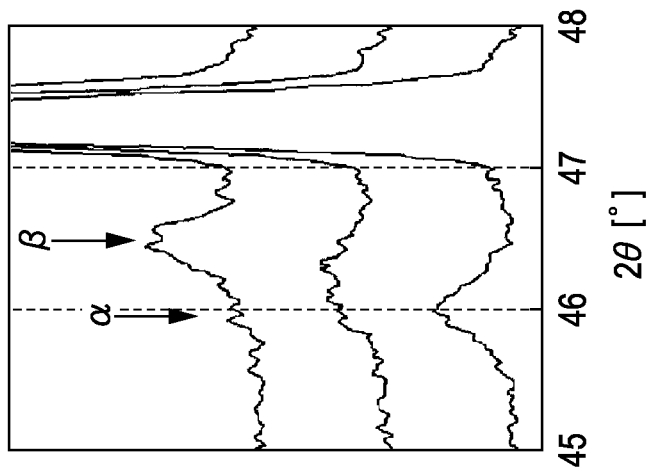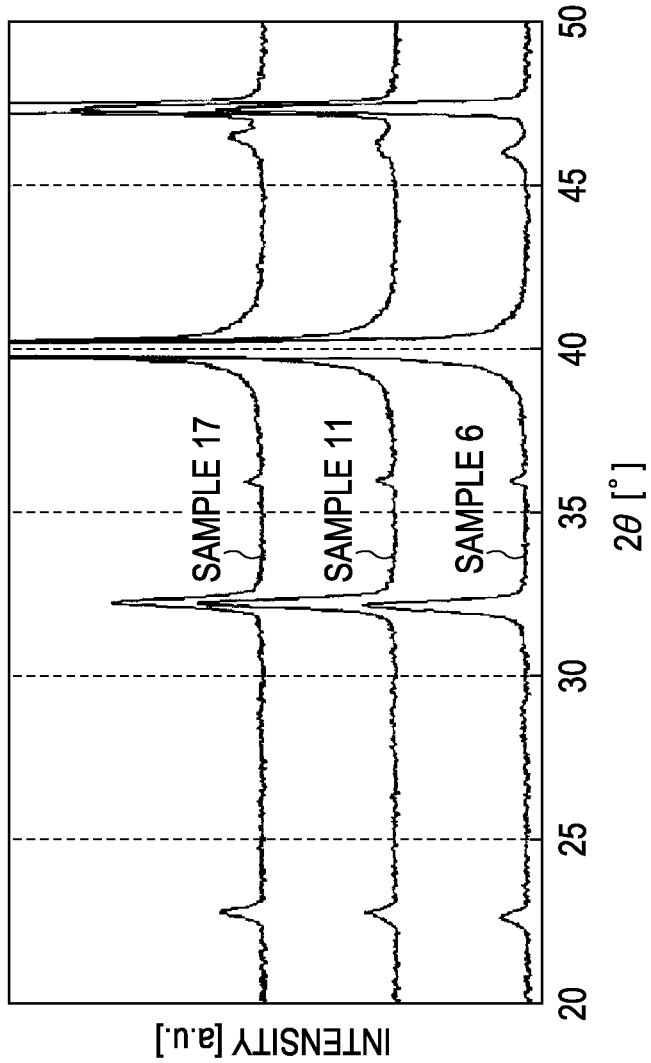

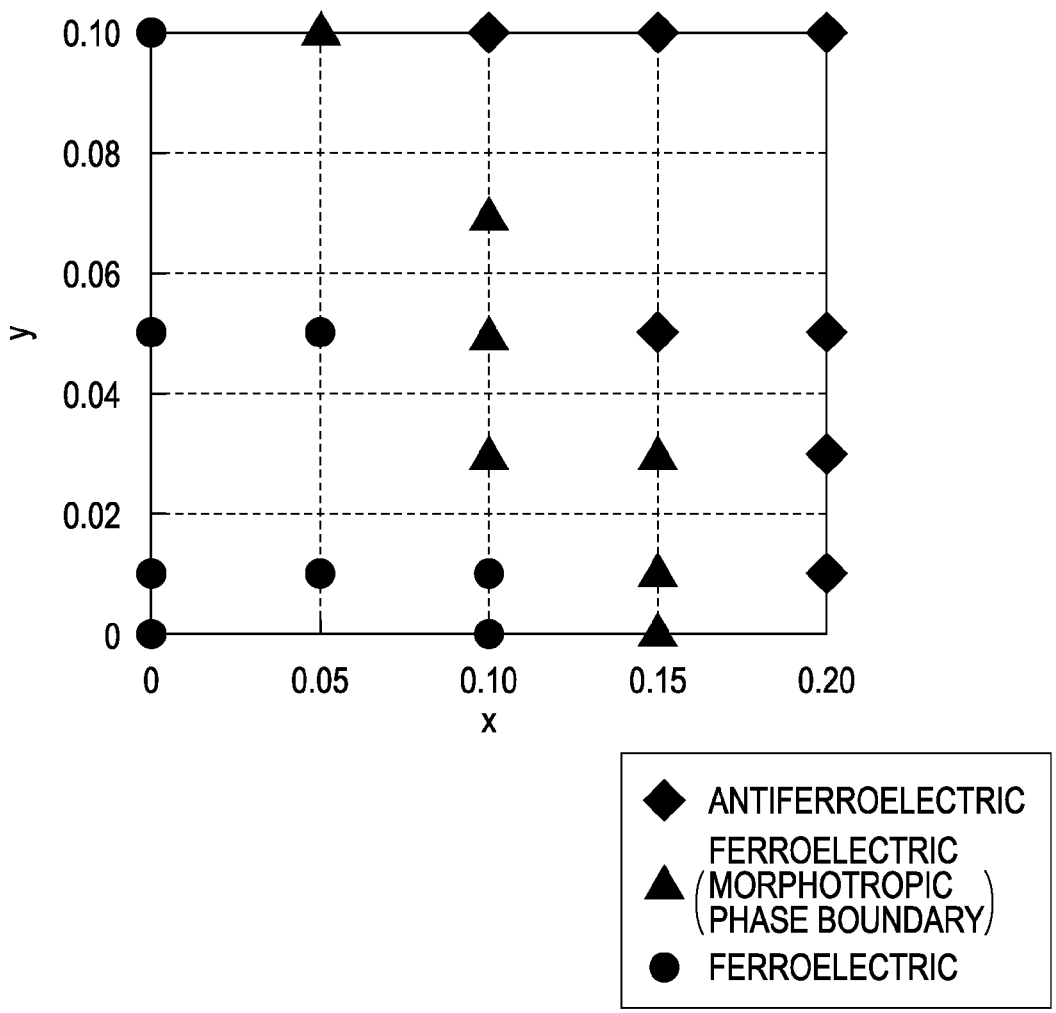

LIQUID EJECTION HEAD

CROSS-REFERENCE TO RELATED APPLICATIONS

This application claims the benefit of priority to Japanese Patent Application No. 2010-056806 filed Mar. 12, 2010, and Japanese Patent Application No. 2010-122800 filed May 28, 2010 the contents of which are hereby incorporated by reference in their entirety.

BACKGROUND

1. Technical Field

The present invention relates to a liquid ejection head having a piezoelectric element that causes a pressure change in a pressure generating chamber communicating with a nozzle opening and has a piezoelectric layer and an electrode for applying a voltage to the piezoelectric layer, a liquid ejection device, a piezoelectric element, and a piezoelectric material.

2. Related Art

Mentioned as piezoelectric elements for use in liquid ejection heads is a piezoelectric element having a structure where a piezoelectric material that exhibits an electromechanically conversion function, such as a piezoelectric layer containing a crystallized dielectric material, is sandwiched between two electrodes. Such a piezoelectric element is mounted on a liquid ejection head as, for example, an actuator device in a bending vibration mode. Mentioned as a typical example of the liquid ejection head is, for example, an ink jet recording head in which a part of a pressure generation chamber communicating with a nozzle opening for discharging ink droplets is constituted by a diaphragm and which discharges ink in the pressure generation chamber as ink droplets from the nozzle opening by deforming the diaphragm by the piezoelectric element to pressurize the ink. Mentioned as the piezoelectric element to be mounted on such an ink jet recording head is, for example, a piezoelectric element formed by forming a uniform piezoelectric material layer throughout the entire surface of the diaphragm by a film formation technique, and then cutting the piezoelectric material layer into a shape corresponding to the pressure generation chamber by a lithography method to be independent for every pressure generation chamber.

The piezoelectric material for use in such a piezoelectric element is required to have high piezoelectric characteristics (distortion level), and lead zirconate titanate (PZT) is mentioned as a typical example (JP-A-2001-223404).

However, a piezoelectric material in which the lead content is reduced has been desired from the viewpoint of environmental problems. Examples of piezoelectric materials not containing lead include $BiFeO_3$ which is a perovskite type complex oxide represented by, for example, $ABO_3$. Such a $BiFeO_3$-based piezoelectric material containing Bi and Fe has problems in that the insulation properties are low and a leakage current occurs. Such problems similarly occur in other piezoelectric elements without being limited to the liquid ejection head typified by the ink jet recording head.

SUMMARY

An advantage of some aspects of the invention is to provide a liquid ejection head having a piezoelectric element that has high insulation properties, can suppress the generation of a leakage current, and has a reduced environmental load, a liquid ejection device, a piezoelectric element, and a piezoelectric material.

According to a first aspect of the invention that solves the above-described problems is a liquid ejection head having a pressure generation chamber communicating with a nozzle opening and a piezoelectric element having a piezoelectric layer and an electrode provided on the piezoelectric layer, in which the piezoelectric layer is a perovskite type complex oxide containing bismuth, iron, and cerium and the piezoelectric layer contains the cerium in a proportion of 0.01 or more and 0.13 or lower in a molar ratio based on the total amount of the bismuth and the cerium.

According to such an aspect, by the use of the piezoelectric material containing a perovskite type complex oxide containing iron and bismuth and a given proportion of cerium for the piezoelectric layer, high insulation properties can be obtained and the generation of a leakage current can be suppressed. Moreover, since the lead content can be reduced, a load to the environment can be reduced.

The piezoelectric layer may further contain lanthanum. According to this aspect, a liquid ejection head having a piezoelectric material that can become a ferroelectric or an antiferroelectric exhibiting an electric field-induced phase transition while maintaining the effects of obtaining high insulation properties and suppressing the generation of a leakage current is obtained. Moreover, a hetero-phase derived from bismuth ferrate can be suppressed.

The piezoelectric layer contains the lanthanum in a proportion of 0.05 or more and 0.20 or lower in a molar ratio based on the total amount of the bismuth, the cerium, and the lanthanum. According to this aspect, a liquid ejection head having a piezoelectric material of a ferroelectric or an antiferroelectric exhibiting an electric field-induced phase transition in accordance with the lanthanum amount is achieved.

The piezoelectric layer may exhibit an electric field-induced phase transition. According to this aspect, a liquid ejection head having a piezoelectric element having a high distortion level can be achieved.

The piezoelectric layer may be a ferroelectric. According to this aspect, a liquid ejection head having a piezoelectric element in which the distortion level is easily controlled, and, for example, the size of droplets to be discharged is easily controlled can be achieved.

It is preferable that, in the piezoelectric layer, a diffraction peak belonging to a phase exhibiting ferroelectricity and a diffraction peak belonging to a phase exhibiting antiferroelectricity be simultaneously observed in a powder X-ray diffraction pattern. According to this aspect, a piezoelectric element having a high distortion level can be obtained due to the presence of a Morphotropic phase boundary (M. P. B.) of an antiferroelectric phase and a ferroelectric phase.

According to a seventh aspect, a liquid ejection device has the liquid ejection head of the aspects described above. According to such an aspect, a liquid ejection device in which dielectric breakdown is prevented and the reliability is excellent is obtained because the liquid ejection device has a liquid ejection head having high insulation properties and capable of suppressing the generation of a leakage current. In addition, a liquid ejection device in which the lead content is reduced and a load to the environment is reduced can be provided.

According to an eighth aspect of the invention, a piezoelectric element has a piezoelectric layer and an electrode provided on the piezoelectric layer, in which the piezoelectric layer is a perovskite type complex oxide containing bismuth, iron, and cerium and the piezoelectric layer contains the cerium in a proportion of 0.01 or more and 0.13 or lower in a molar ratio based on the total amount of the bismuth and the cerium. According to the aspect, high insulation properties can be obtained and the generation of a leakage current can be suppressed by the use of a piezoelectric material containing a perovskite type complex oxide containing iron and bismuth and a given ratio of cerium for the piezoelectric layer. Moreover, since the lead content can be reduced, a load to the environment can be reduced.

According to a ninth aspect of the invention, a piezoelectric material which is a perovskite type complex oxide containing bismuth, iron, and cerium and which contains the cerium in a proportion of 0.01 or more and 0.13 or lower in a molar ratio based on the total amount of the bismuth and the cerium. According to the aspect, a piezoelectric material in which the insulation properties are high and the generation of a leakage current can be suppressed is obtained. Moreover, since the lead content can be reduced, a load to the environment can be reduced.

BRIEF DESCRIPTION OF THE DRAWINGS

The invention will be described with reference to the accompanying drawings, wherein like numbers reference like elements.

FIG. 16 is a diagram illustrating the X ray diffraction pattern of the samples 6, 11, and 17.

FIG. 17 is a diagram in which the analysis results of the X ray diffraction pattern are plotted against the composition.

DESCRIPTION OF EXEMPLARY EMBODIMENTS

First Embodiment

Figure 1:
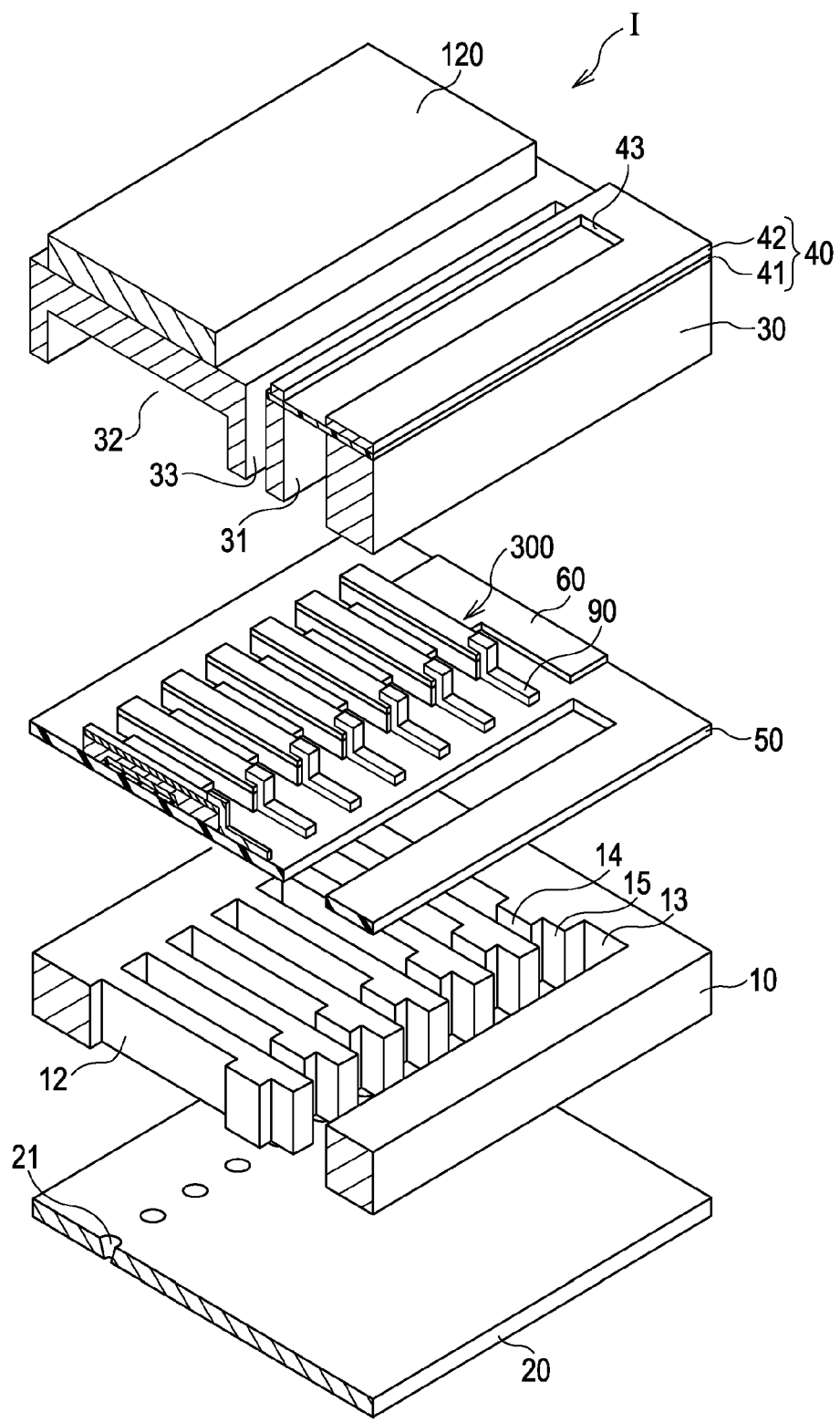
FIG. 1 is an exploded perspective view schematically illustrating the structure of a recording head according to a first embodiment.
Figure 2:
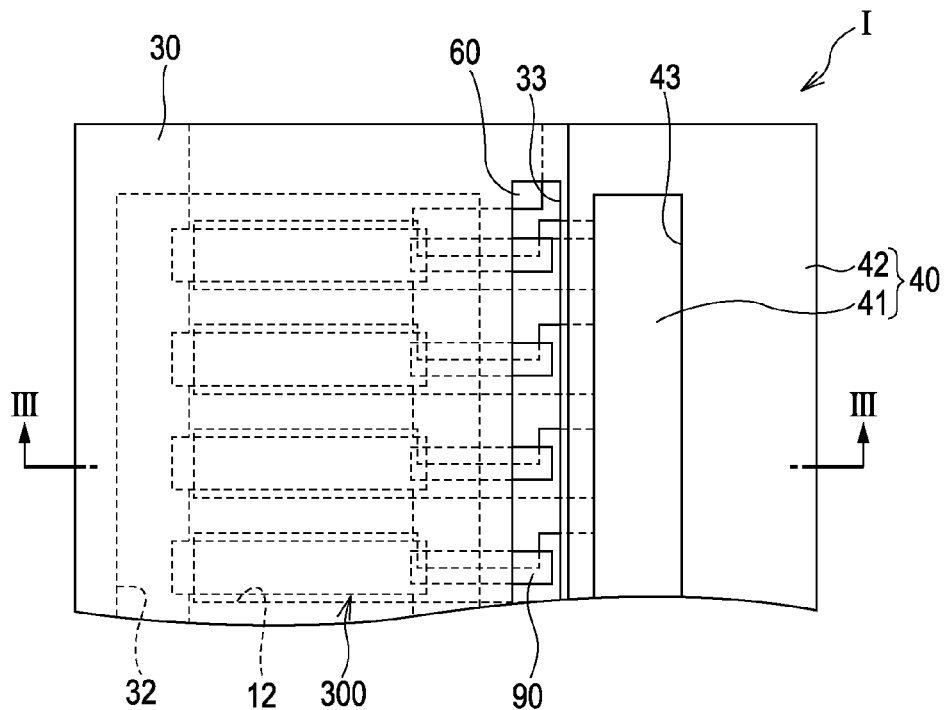
FIG. 2 is a plan view of the recording head according to the first embodiment.
Figure 3:
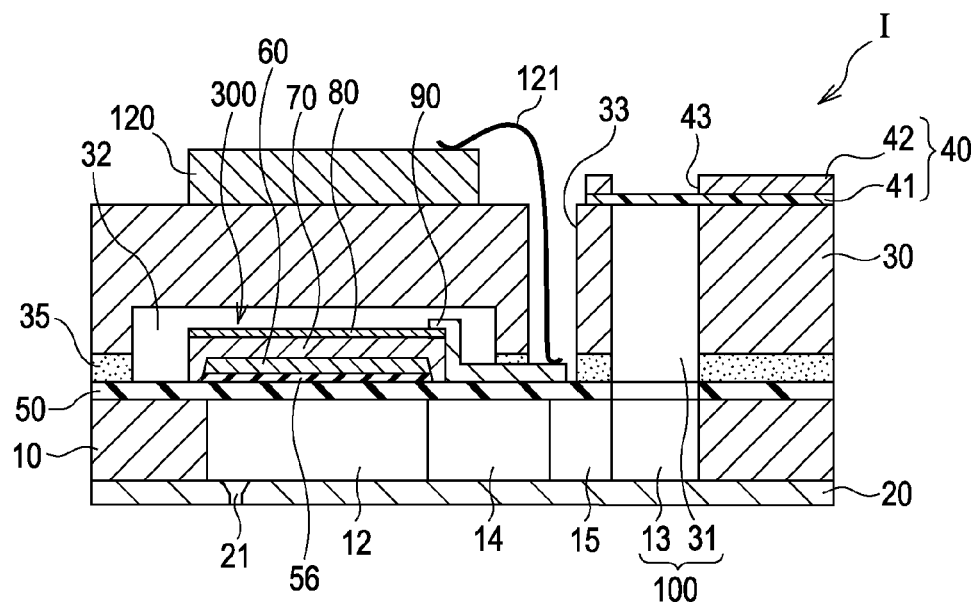
FIG. 3 is a cross sectional view of the recording head according to the first embodiment.

FIG. 1 is an exploded perspective view schematically illustrating the structure of an ink jet recording head which is one example of a liquid ejection head according to a first embodiment of the invention, FIG. 2 is a plan view of FIG. 1, and FIG. 3 is a cross sectional view along the III-III line of FIG. 2. As illustrated in FIGS. 1 to 3, a flow path forming substrate 10 of this embodiment contains a silicon single crystal substrate, on one surface of which an elastic film 50 containing silicon dioxides is formed.

In the flow path forming substrate 10, two or more pressure generation chambers 12 are arranged in parallel in the width direction thereof. In an outside region in the longitudinal direction of the pressure generation chambers 12 of the flow path forming substrate 10, a communication portion 13 is formed and the communication portion 13 and each pressure generation chamber 12 are communicated with each other through an ink supply path 14 and a communication path 15 provided for every pressure generation chamber 12. The communication portion 13 communicates with a reservoir portion 31 of a protective substrate described later to constitute a part of a reservoir to serve as a common ink chamber of the respective pressure generation chambers 12. The ink supply path 14 is formed with a narrower width than that of the pressure generation chamber 12 and keeps the flow path resistance of ink flowing into the pressure generation chamber 12 from the communication portion 13 at a constant rate. In this embodiment, the ink supply path 14 is formed by narrowing the width of the flow path from one side but the ink supply path may be formed by narrowing the width of the flow path from both sides. The ink supply path may be formed by narrowing in the thickness direction instead of narrowing the width of the flow path. In this embodiment, the flow path forming substrate 10 is provided with a liquid flow path constituted by the pressure generation chambers 12, the communication portion 13, the ink supply paths 14, and the communication paths 15.

To the opening surface side of the flow path forming substrate 10, a nozzle plate 20 in which nozzle openings 21 each communicating with the vicinity of the end of each pressure generation chamber 12 opposite to the ink supply paths 14 are formed is adhered with an adhesive, a thermally welding film, or the like. The nozzle plate 20 contains glass ceramics, a silicon single crystal substrate, stainless steel, or the like, for example.

In contrast, on the side opposite to the opening surface of such a flow path forming substrate 10, the elastic film 50 is formed as described above. On the elastic film 50, an adhesion layer 56 containing titanium oxide for increasing the adhesion of the elastic film 50 or the like with the base of a first electrode 60 is provided. On the elastic film 50, an insulator film containing zirconium dioxide or the like may be provided as required.

Furthermore, on the adhesion layer 56, the first electrode 60, a piezoelectric layer 70 which is a thin film having a thickness of 2 μm or lower and preferably 1 to 0.3 μm, and a second electrode 80 are laminated to constitute a piezoelectric element 300. Here, the piezoelectric element 300 refers to a portion containing the first electrode 60, the piezoelectric layer 70, and the second electrode 80. In general, any one of the electrodes of the piezoelectric elements 300 is used as a common electrode and the other electrodes and the piezoelectric layers 70 are formed by patterning for every pressure generation chamber 12. In this embodiment, the first electrode 60 is used as the common electrode of the piezoelectric elements 300 and the second electrode 80 is used as an individual electrode of the piezoelectric elements 300 but the electrodes may be used in an opposite manner depending on a drive circuit or wiring. Here, a combination of the piezoelectric element 300 and a diaphragm in which displacement arises by the drive of the piezoelectric element 300 is referred to as an actuator device. In the above-described example, the elastic film 50, the adhesion layer 56, the first electrode 60, and the insulator film provided as required act as the diaphragm. However, it is a matter of fact that the invention is not limited to the example and the elastic film 50 or the adhesion layer 56 may not be provided, for example. The piezoelectric element 300 may substantially serve as the diaphragm.

In this embodiment, a piezoelectric material constituting the piezoelectric layer 70 is a perovskite type complex oxide containing bismuth, iron, and cerium. On the A site of the perovskite type complex oxide, i.e., an $ABO_3$ type complex oxide, twelve oxygens are coordinated and, on the B site, six oxygens are coordinated to form an octahedron. On the A site, bismuth (Bi) and cerium (Ce) are positioned and, on the B site, iron (Fe) is positioned. More specifically, the perovskite type complex oxide containing bismuth, iron, and cerium is presumed to have a structure where a part of Bi of bismuth ferrate is replaced by Ce.

In this embodiment, in the perovskite type complex oxide containing bismuth, iron, and cerium, Ce is contained in a proportion of 0.01 or more and 0.13 or lower in a molar ratio based on the total amount of Bi and Ce.

Thus, when the perovskite type complex oxide containing bismuth, iron, and cerium is used as the piezoelectric material constituting the piezoelectric layer 70 and the proportion of the cerium is adjusted to be 0.01 or more and 0.13 or lower in a molar ratio based on the total amount of the bismuth and the cerium, the insulation properties can be made high and a leakage current can be suppressed as compared with a piezoelectric material not containing Ce, i.e., a $BiFeO_3$ type piezoelectric material containing Bi and Fe and not containing Ce as shown in Examples described later. It is a matter of course that since the lead content can be reduced, a load to the environment can be reduced. For example, the piezoelectric layer 70 in which a leakage current when a 500 $kVcm^{-1}$ electric field is applied is equal to or lower than $1.0 \times 10^{-1} Acm^{-2}$ can be achieved.

The piezoelectric layer 70 may further contain lanthanum (La). By the use of a perovskite type complex oxide containing bismuth, iron, cerium, and lanthanum, a piezoelectric material that can become a ferroelectric or an antiferroelectric exhibiting an electric field-induced phase transition. The perovskite type complex oxide containing bismuth, iron, cerium, and lanthanum is presumed to have a structure where a part of Bi of bismuth ferrate is replaced by Ce and La.

It is a matter of course that even in the case of a piezoelectric material further containing La, the effects of increasing the insulation properties to a high degree and suppressing a leakage current can also be maintained. The La content is not limited and may be adjusted to be, for example, 0.05 or more and 0.20 or lower in a molar ratio based on the total amount of Bi, Ce, and La.

Here, the electric field-induced phase transition is a phase transition caused by an electric field and refers to a phase transition from an antiferroelectric phase to a ferroelectric phase or a phase transition from a ferroelectric phase to an antiferroelectric phase. The ferroelectric phase refers to a state where the polarization axes are oriented in the same direction and the antiferroelectric phase refers to a state where the polarization axes are oriented in the opposite direction. For example, the phase transition from an antiferroelectric phase to a ferroelectric phase refers to a state where the polarization axes oriented in the opposite direction of the antiferroelectric phase rotate 180°, so that the polarization axes are oriented in the same direction to convert the phase to a ferroelectric phase. A distortion caused by expansion or contraction of a lattice due to such an electric field-induced phase transition is an electric field-induced phase transition distortion caused by the electric field-induced phase transition.

Figure 4:
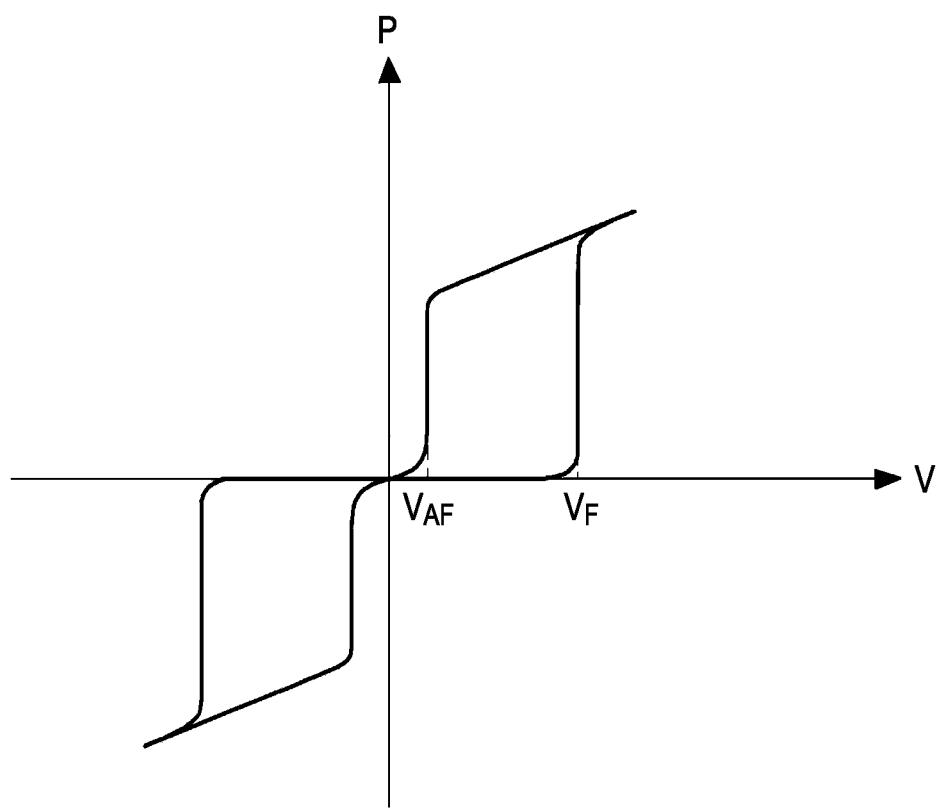
FIG. 4 is a diagram illustrating the P-V hysteresis of an antiferroelectric.

A substance exhibiting such an electric field-induced phase transition is the antiferroelectric. In other words, a substance in which the polarization axes are oriented in the opposite direction in a state where there is no electric field and the polarization axes rotate by an electric field to be oriented in the same direction is the antiferroelectric. Such an antiferroelectric exhibits a double hysteresis having two hysteresis loop shapes in a positive electric field direction and a negative electric field direction as illustrated in FIG. 4 illustrating one example of the P-V curve representing the relationship between the polarization P and the voltage V of the antiferroelectric. In FIG. 4, the regions VF and VAF where the polarization rapidly changes are portions where the phase transition from the ferroelectric phase to the antiferroelectric phase or the phase transition from the ferroelectric phase to the antiferroelectric phase occurs. Unlike the antiferroelectric, the ferroelectric exhibits a hysteresis curve in the P-V curve, in which the distortion level linearly changes to an applied voltage by orienting the polarization direction to one direction.

In contrast, in the antiferroelectric, the P-V curve does not exhibit a double hysteresis which is observed in the antiferroelectric and the distortion level linearly changes to an applied voltage by orienting the polarization direction to one direction. Thus, since the distortion level is easily controlled, the size of droplets to be discharged is easily controlled, and both a small-amplitude vibration that causes a slight vibration and a large-amplitude vibration that generates a large excluded volume can be generated by one piezoelectric element.

In the case of the ferroelectric, when the piezoelectric layer 70 is subjected to powder X-ray diffraction measurement, the diffraction peak belonging to a phase exhibiting ferroelectricity (ferroelectric phase) is observed in the diffraction pattern. It is preferable that the diffraction peak belonging to the phase exhibiting ferroelectricity (ferroelectric phase) and the diffraction peak belonging to a phase exhibiting antiferroelectricity (antiferroelectric phase) be simultaneously observed. Thus, in the case of the piezoelectric layer 70 in which the diffraction peak belonging to the phase exhibiting ferroelectricity and the diffraction peak belonging to the phase exhibiting antiferroelectricity are simultaneously observed, i.e., exhibiting the Morphotropic phase boundary (M. P. B.) of the antiferroelectric phase and the ferroelectric phase, a piezoelectric element having a high distortion level can be achieved among ferroelectrics. The diffraction peak belonging to the phase exhibiting ferroelectricity is observed near $2\theta=46°$ when powder X-ray diffraction measurement is carried out, for example. The diffraction peak belonging to the phase exhibiting antiferroelectricity is observed near $2\theta=46.5°$ when powder X-ray diffraction measurement using a $CuK\alpha$ line as the X-ray source is carried out, for example. These diffraction peak positions are dependent on planar spacing and a shift in the diffraction peak position may occur due to changes in a stress from a substrate or the outside depending on a creation method, shape, external stress, or the like. In contrast, in the antiferroelectric, the diffraction peak belonging to the phase exhibiting ferroelectricity is not observed and only the diffraction peak belonging to the phase exhibiting antiferroelectricity is observed.

When the piezoelectric layer 70 contains La, a heterophase derived from bismuth ferrate can be suppressed.

To each of the second electrodes 80 which are individual electrodes of such piezoelectric elements 300, a lead electrode 90 containing gold (Au) or the like, for example, which is drawn from the vicinity of the end at the ink supply path 14 side to be extended onto the elastic film 50 or the insulator film provided as required.

On the flow path forming substrate 10 on which such piezoelectric elements 300 are formed, i.e., on the first electrode 60, the elastic film 50, the insulator film provided as required, and the lead electrode 90, a protective substrate 30 having the reservoir portion 31 constituting at least one part of a reservoir 100 is joined through an adhesive 35. The reservoir portion 31 is formed penetrating the protective substrate 30 in the thickness direction and in the width direction of the pressure generation chamber 12 and is communicated with the communication portion 13 of the flow path forming substrate 10 as described above to constitute the reservoir 100 to serve as a common ink chamber of the respective pressure generation chambers 12 in this embodiment. Or, the communication portion 13 of the flow path forming substrate 10 may be divided into two or more portions for every pressure generation chamber 12, so that only the reservoir portion 31 may be used as a reservoir. Or, only the pressure generation chambers 12 may be provided in the flow path forming substrate 10 and the ink supply path 14 communicating with the reservoir 100 and the respective pressure generation chambers 12 may be provided to a member (e.g., the elastic film 50 or the insulator film provided as required) provided between the flow path forming substrate 10 and the protective substrate 30, for example.

At a region facing the piezoelectric elements 300 of the protective substrate 30, a piezoelectric element holding portion 32 having a space so as not to impede the movement of the piezoelectric elements 300 is provided. The piezoelectric element holding portion 32 may have a space so as not to impede the movement of the piezoelectric elements 300 and the space may be sealed or may not be sealed.

As such a protective substrate 30, it is preferable to use materials having substantially the same coefficient of thermal expansion as that of the flow path forming substrate 10, such as glass and ceramic materials. In this embodiment, the protective substrate 30 is formed using a silicon single crystal substrate which is the same material as that of the flow path forming substrate 10.

In the protective substrate 30, a penetration hole 33 penetrating the protective substrate 30 in the thickness direction is provided. The vicinity of the end of the lead electrode 90 drawn from each of the piezoelectric elements 300 is provided in such a manner as to be exposed in the penetration hole 33.

On the protective substrate 30, a drive circuit 120 for driving the piezoelectric elements 300 arranged in parallel is fixed. As the drive circuit 120, a circuit substrate, a semiconductor integrated circuit (IC), or the like can be used, for example. The drive circuit 120 and the lead electrode 90 are electrically connected to each other through a connection wiring 121 containing a conductive wire, such as a bonding wire.

Onto such a protective substrate 30, a compliance substrate 40 containing a sealing film 41 and a fixing plate 42 is joined. Here, the sealing film 41 contains materials having low rigidity and flexibility. One area of the reservoir portion 31 is sealed with the sealing film 41. The fixing plate 42 is formed with a relatively hard material. A region facing the reservoir 100 of the fixing plate 42 is an opening portion 43 completely opening in the thickness direction. Thus, one are of the reservoir 100 is sealed only by the sealing film 41 having flexibility.

In such an ink jet recording head I of this embodiment, an ink is taken from an ink introduction port connected to an ink supply member (not illustrated) at the outside, the inside thereof from the reservoir 100 to the nozzle opening 21 is filled with the ink, and a voltage is applied between the first electrode 60 and the second electrode 80 corresponding to each of the pressure generation chambers 12 in accordance with a record signal from the drive circuit 120 to bend and deform the elastic film 50, the adhesion layer 56, the first electrode 60, and the piezoelectric layer 70 to thereby increase the pressure in each of the pressure generation chamber 12, whereby ink droplets are discharged from the nozzle openings 21.

Next, one example of a method for manufacturing the ink jet recording head of this embodiment will be described with reference to FIGS. 5 to 9. FIGS. 5 to 9 are cross sectional views in the longitudinal direction of the pressure generation chamber.

Figure 5A:
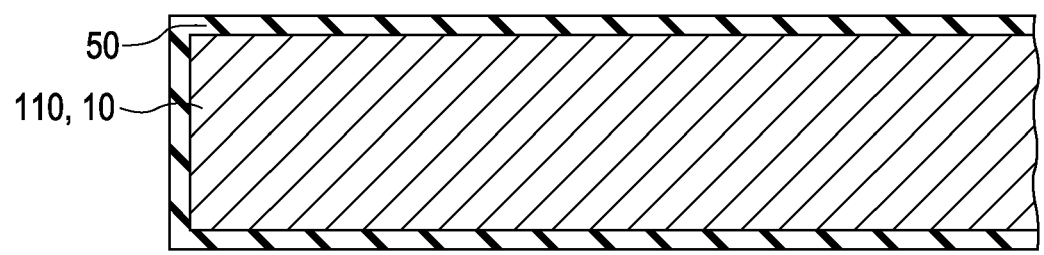
FIGS. 5A and 5B are cross sectional views illustrating a process for manufacturing the recording head according to the first embodiment.
Figure 5B:
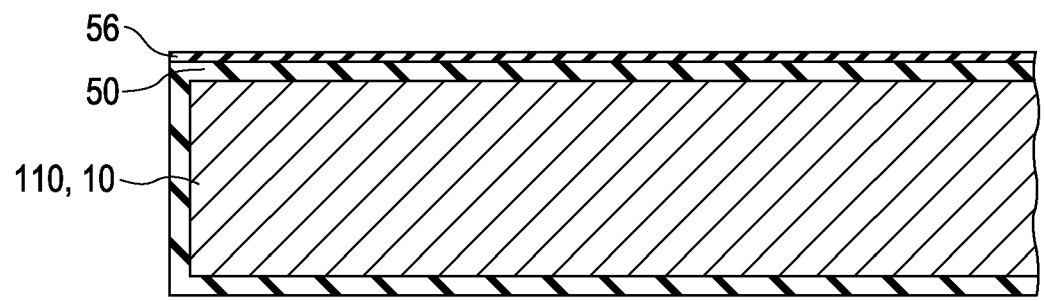

First, as illustrated in FIG. 5A, a silicon dioxide film containing silicon dioxide ($SiO_2$) or the like constituting the elastic film 50 is formed on the surface of a flow path forming substrate wafer 110 which is a silicon wafer by thermal oxidation or the like. Subsequently, as illustrated in FIG. 5B, the adhesion layer 56 containing titanium oxide or the like is formed by a reactive sputtering method, thermal oxidation, or the like, on the elastic film 50 (silicon dioxide film).

Figure 6A:
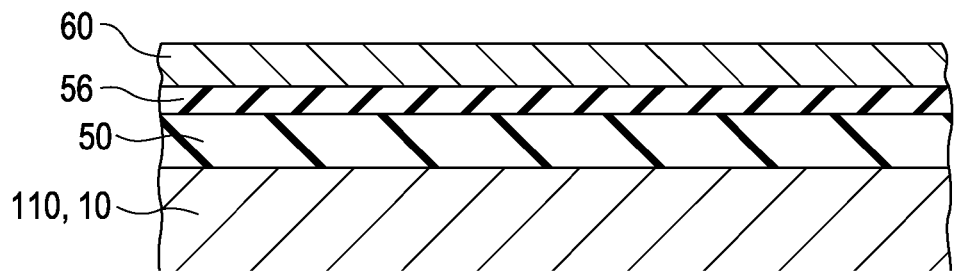
FIGS. 6A to 6C are cross sectional views illustrating the process for manufacturing the recording head according to the first embodiment.

Next, as illustrated in FIG. 6A, the first electrode 60 containing platinum, iridium, iridium oxide, or a laminate thereof is formed on the entire surface of the adhesion layer 56 by a sputtering method or the like.

Subsequently, the piezoelectric layer 70 is laminated on the first electrode 60. Methods for manufacturing the piezoelectric layer 70 are not limited. For example, the piezoelectric layer 70 can be formed by a chemical solution method, such as an MOD (Metal-Organic Decomposition) method including applying a solution in which an complex is dissolved and dispersed in a solvent and drying the same, and then firing the same at a high temperature to thereby obtain the piezoelectric layer 70 or a sol-gel method. In addition, a laser ablation method, a sputtering method, a pulsed•laser deposition method (PLD method), a CVD method, an aerosol deposition method, and the like may be used.

Figure 6B:
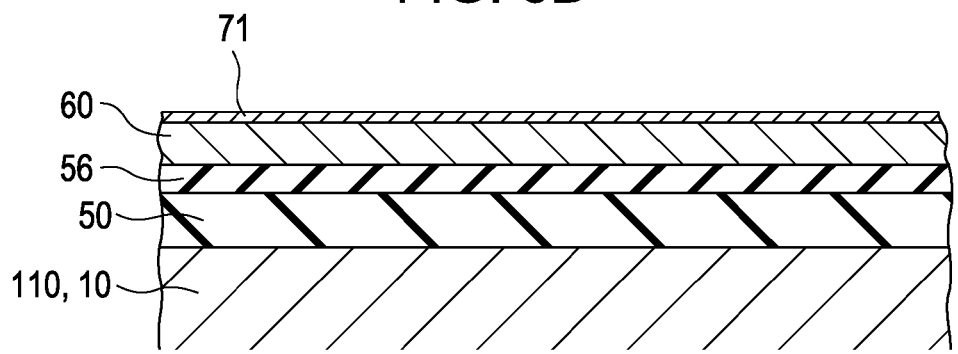

A specific example of a procedure for forming the piezoelectric layer 70 is as follows. First, as illustrated in FIG. 6B, a sol or an MOD solution (precursor solution) containing an complex, specifically, an complex containing Bi, Ce, and Fe, and La, which is blended as required at a target ratio is applied onto the first electrode 60 using a spin coating method or the like to thereby form the piezoelectric precursor film 71 (application process).

The precursor solution to be applied is obtained by mixing complexes containing each of Bi, Ce, Fe, and La so that the molar ratio of each metal becomes a desired molar ratio, and then dissolving or dispersing the mixture using an organic solvent, such as alcohol. As the complexes containing each of Bi, Ce, Fe, and La, a metal alkoxide, an organic acid salt, a β diketone complex, and the like can be used, for example. Examples of the complex containing Bi include 2-ethylhexanoic acid bismuth. Examples of the complex containing Fe include 2-ethylhexanoic acid iron. Examples of the complex containing Ce include 2-ethyl hexanoic acid cerium. Examples of the complex containing La include 2-ethyl hexanoic acid lanthanum.

Subsequently, the piezoelectric precursor film 71 is heated to a given temperature, and is dried for a defined period of time (drying process). Next, the dried piezoelectric precursor film 71 is degreased by heating the same to a given temperature, and holding the same for a defined period of time (degreasing process). The degreasing process as used herein refers to a process for removing the organic ingredients contained in the piezoelectric precursor film 71 as $NO_2$, $CO_2$, $H_2O$, or the like, for example. The atmosphere of the drying process or the degreasing process is not limited and the processes may be carried out in the air or inactive gas.

Figure 6C:
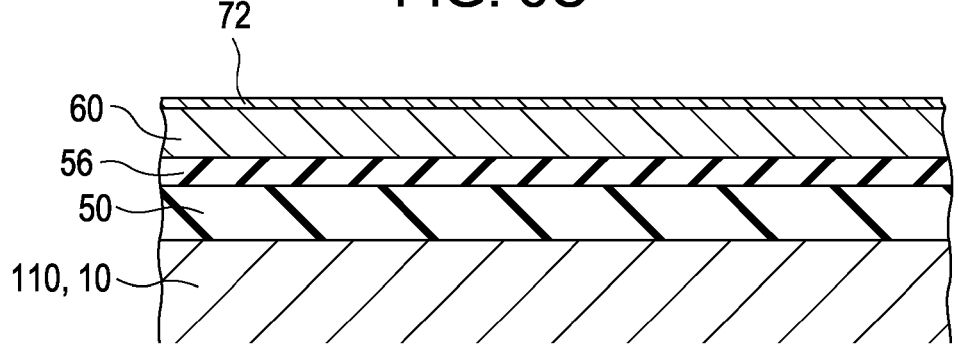

Next, as illustrated in FIG. 6C, the piezoelectric precursor film 71 is crystallized by heating the same to a given temperature, e.g., about 600 to 700° C., and holding the same for a defined period of time to form the piezoelectric film 72 (firing process). Also in the firing process, the atmosphere is not limited and the process may be carried out in the air or inactive gas.

Examples of heating devices for use in the drying process, the degreasing process, and the firing process include an RTA (Rapid Thermal Annealing) device that performs heating by irradiation of an infrared lamp or a hot plate.

Figure 7A:
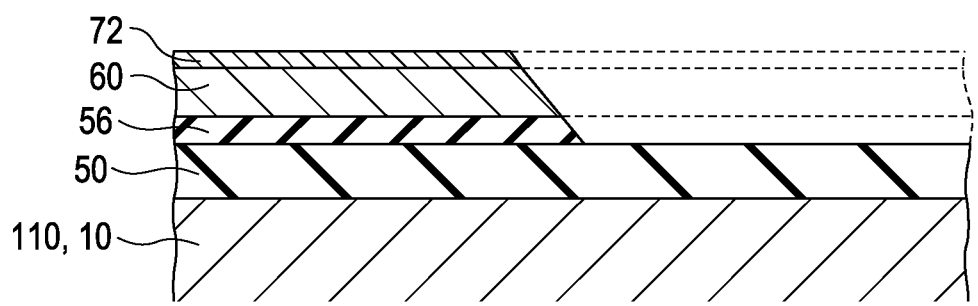
FIGS. 7A and 7B are cross sectional views illustrating the process for manufacturing the recording head according to the first embodiment.

Next, as illustrated in FIG. 7A, on the piezoelectric film 72, the first electrode 60 and a first layer of the piezoelectric film 72 are simultaneously patterned using a resist having a given shape (not illustrated) as a mask so that the sides thereof incline.

Figure 7B:
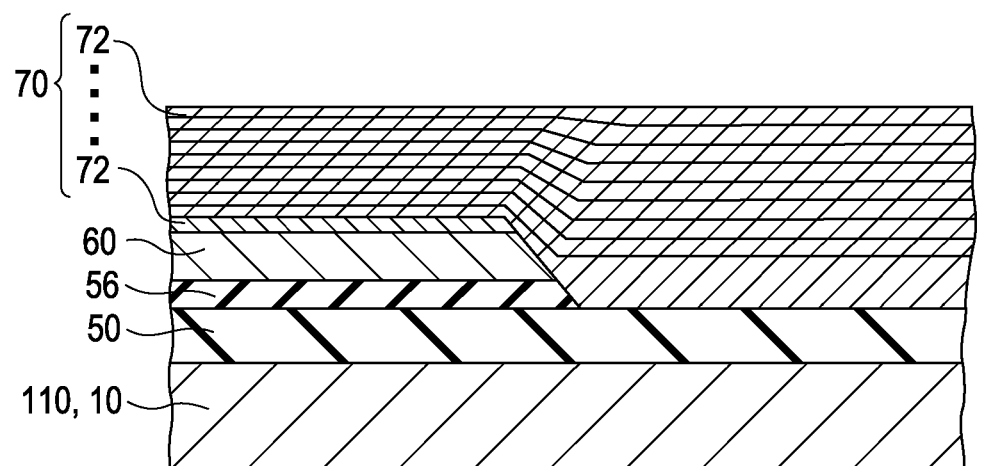

Subsequently, the resist is separated, and then the application process, the drying process, and the degreasing process described above or an application process, a drying process, a degreasing process, and a firing process are repeated two or more times in accordance with a desired film thickness or the like to form the piezoelectric layer 70 containing two or more of the piezoelectric films 72, thereby forming the piezoelectric layer 70 containing two or more of the piezoelectricity film 72 and having a given thickness as illustrated in FIG. 7B. For example, when the film thickness per application of the coating solution is about 0.1 µm, the film thickness of the entire piezoelectric layer 70 containing ten layers of the piezoelectric films 72 is about 1.1 µm, for example. In this embodiment, the piezoelectric film 72 is provided by lamination but the piezoelectric film 72 may contain only one layer.

After forming the piezoelectric layer 70 as described above, as illustrated in FIG. 8A, the second electrode 80 containing platinum or the like is formed by a sputtering method or the like on the piezoelectric layer 70, and the piezoelectric layer 70 and the second electrode 80 are simultaneously patterned in a region facing each of the pressure generation chambers 12, thereby forming the piezoelectric element 300 containing the first electrode 60, the piezoelectric layer 70, and the second electrode 80. The patterning of the piezoelectric layer 70 and the second electrode 80 can be carried out at once by carrying out by dry etching through a resist (not illustrated) formed into a given shape. Thereafter, post-annealing may be carried out in a temperature range (600° C. to 700° C.) as required. Thus, a favorable interface of the piezoelectric layer 70 and the first electrode 60 or the second electrode 80 can be formed and the crystallinity of the piezoelectric layer 70 can be improved.

Figure 8A:
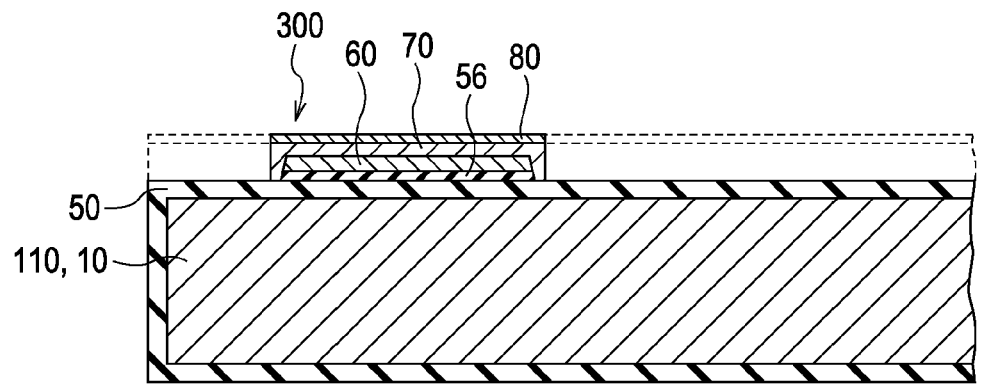
FIGS. 8A to 8C are cross sectional views illustrating the process for manufacturing the recording head according to the first embodiment.
Figure 8B:
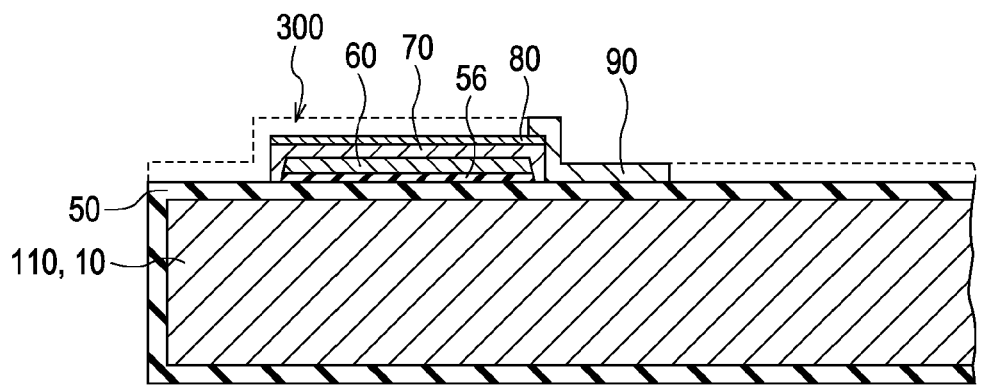
Figure 8C:
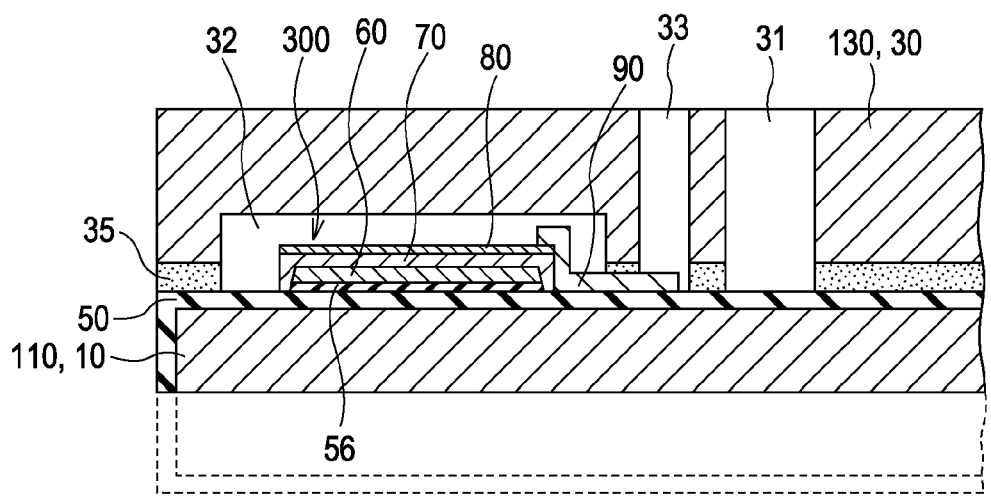

Next, as illustrated in FIG. 8B, patterning is carried out for every piezoelectric element 300 through a mask pattern (not illustrated) containing, for example, a resist or the like on the entire surface of the flow path forming substrate wafer 110 after the formation of the lead electrode 90 containing gold (Au), for example. Next, as illustrated in FIG. 8C, a protective substrate wafer 130 which is a silicon wafer and forms two or more protective substrates 30 is joined through the adhesive 35 to the piezoelectric element 300 side of the flow path forming substrate wafer 110, and then the thickness of the flow path forming substrate wafer 110 is reduced to a given thickness.

Figure 9A:
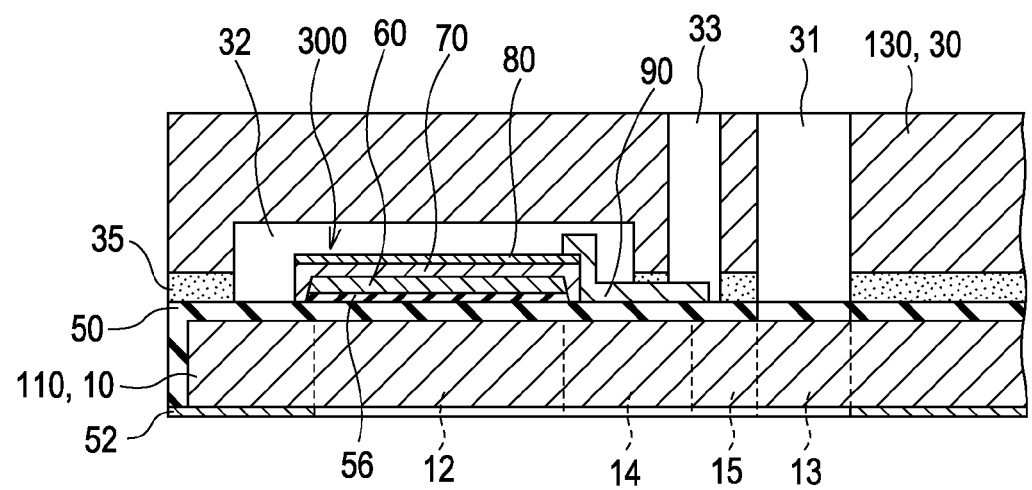
FIGS. 9A and 9B are cross sectional views illustrating the process for manufacturing the recording head according to the first embodiment.
Figure 9B:
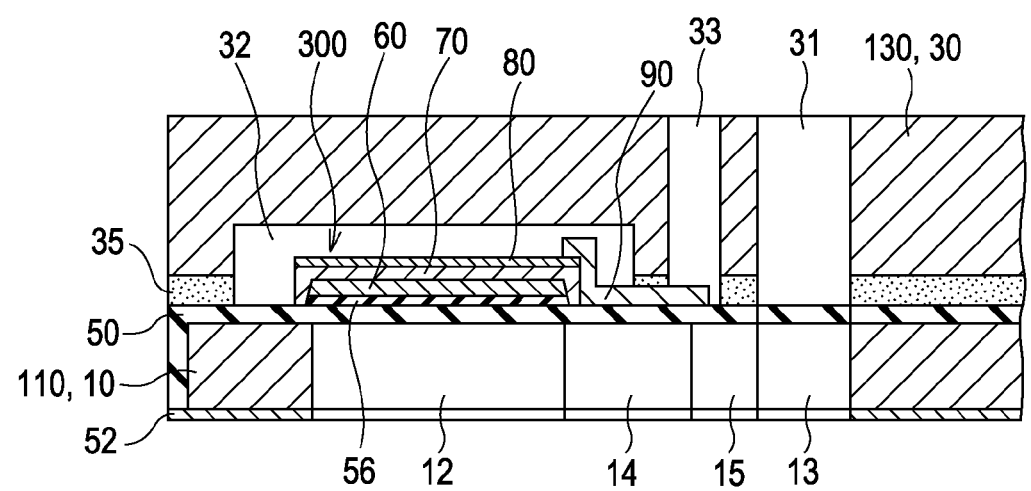

Next, as illustrated in FIG. 9A, a mask film 52 is newly formed on the flow path forming substrate wafer 110, and is patterned into a given shape. As illustrated in FIG. 9B, by carrying out anisotropic etching (wet etching) of the flow path forming substrate wafer 110 using an alkaline solution of KOH or the like through the mask film 52, the pressure generation chamber 12, the communication portion 13, the ink supply path 14, the communication path 15, and the like corresponding to the piezoelectric element 300 are formed.

Thereafter, unnecessary portions of the peripheral edge of the flow path forming substrate wafer 110 and the protective substrate wafer 130 are removed by cutting by dicing or the like, for example. Then, the mask film 52 on the surface opposite to the protective substrate wafer 130 of the flow path forming substrate wafer 110 is removed. Thereafter, the nozzle plate 20 in which the nozzle openings 21 are formed is joined and the compliance substrate 40 is joined to the protective substrate wafer 130, and then the flow path forming substrate wafer 110 or the like is divided into one-chip size of the flow path forming substrate 10 or the like as illustrated in FIG. 1, thereby obtaining the ink jet recording head I of this embodiment.

EXAMPLES

Hereinafter, the invention will be more specifically described with reference to Examples but is not limited to the following Examples.

Sample 1

First, a silicon dioxide film having a film thickness of 1070 nm was formed on the surface of a silicon (110) substrate by thermal oxidation. Next, a titanium film was formed on the silicon dioxide film by an RF sputtering method, and was thermally oxidized to form a titanium oxide film having a film thickness of 40 nm. Next, a platinum film having a film thickness of 130 nm was formed on the titanium oxide film by a DC sputtering method to be used as a first electrode oriented along (111).

Subsequently, a piezoelectric layer was formed on the first electrode by a spin coating method. The procedure is as follows. First, a xylene solution and an octane solution of 2-ethylhexanoic acid bismuth, 2-ethylhexanoic acid cerium, and 2-ethylhexanoic acid iron were mixed at a given ratio to prepare a precursor solution. The precursor solution was added dropwise onto the substrate on which the titanium oxide film and the first electrode were formed, and the substrate was rotated at 1500 rpm, thereby forming a piezoelectric precursor film (application process). Next, drying and degreasing were performed for 3 minutes at 350° C. (drying and degreasing process). The application process and the drying and degreasing process were repeated 3 times, and then firing was performed at 650° C. for 3 minutes under a nitrogen atmosphere (nitrogen flow with a flow rate of 100 cc/minute in a heating device) by Rapid Thermal Annealing (RTA) (firing process). By repeating, 3 times, a process including performing the firing process in which firing is performed at once after repeating the application process and the drying and degreasing process 3 times, i.e., performing the application processes nine times in total, a piezoelectric layer having a thickness of 564 nm as a whole was formed.

Thereafter, a platinum film having a film thickness of 100 nm was formed by a DC sputtering method as a second electrode on the piezoelectric layer, and then fired at 650° C. for 5 minutes using RTA, thereby forming the piezoelectric element 300 containing a complex oxide, which is a perovskite type complex oxide containing bismuth, iron, and cerium and has a molar ratio of each metal of $Bi:La:Ce:Fe=(1-x-y):x:y:1$ (the x and y values are as shown in Table 1), as the piezoelectric layer 70.

Samples 2 to 4

The piezoelectric element 300 was formed in the same manner as in Example 1, except changing the mixing ratios of a xylene solution and an octane solution of 2-ethylhexanoic acid bismuth, 2-ethylhexanoic acid cerium, and 2-ethylhexanoic acid iron and using a complex oxide of $Bi:La:Ce:Fe=(1-x-y):x:y:1$ (the x and y values are as shown in Table 1) as the piezoelectric layer 70.

Samples 5 to 22

The piezoelectric element 300 was formed in the same manner as in Example 1, except using a mixture obtained by mixing a xylene solution and an octane solution of 2-ethylhexanoic acid bismuth, 2-ethylhexanoic acid lanthanum, 2-ethylhexanoic acid cerium and 2-ethylhexanoic acid iron at a given ratio, repeating the firing process 4 times in which firing is performed at once after repeating the application process and the drying and degreasing process 3 times, and using a complex oxide of $Bi:La:Ce:Fe=(1-x-y):x:y:1$ (x and y values are as shown in Table) as the piezoelectric layer 70.

TABLE

| | 1 − x − y | X | Y | Ce/(Ce + Bi) | La/(Ce + Bi + La) |
|---|---|---|---|---|---|
| Sample 1 | 0.99 | 0.00 | 0.01 | 0.01 | 0.00 |
| Sample 2 | 0.95 | 0.00 | 0.05 | 0.05 | 0.00 |
| Sample 3 | 0.90 | 0.00 | 0.10 | 0.10 | 0.00 |
| Sample 4 (Comp. Ex.) | 1.00 | 0.00 | 0.00 | 0.00 | 0.00 |
| Sample 5 | 0.94 | 0.05 | 0.01 | 0.01 | 0.05 |
| Sample 6 | 0.90 | 0.05 | 0.05 | 0.05 | 0.05 |
| Sample 7 | 0.85 | 0.05 | 0.10 | 0.11 | 0.05 |
| Sample 8 (Comp. Ex.) | 0.90 | 0.10 | 0.00 | 0.00 | 0.10 |
| Sample 9 | 0.89 | 0.10 | 0.01 | 0.01 | 0.10 |
| Sample 10 | 0.87 | 0.10 | 0.03 | 0.03 | 0.10 |
| Sample 11 | 0.85 | 0.10 | 0.05 | 0.06 | 0.10 |
| Sample 12 | 0.83 | 0.10 | 0.07 | 0.08 | 0.10 |
| Sample 13 | 0.80 | 0.10 | 0.10 | 0.11 | 0.10 |
| Sample 14 (Comp. Ex.) | 0.85 | 0.15 | 0.00 | 0.00 | 0.15 |
| Sample 15 | 0.84 | 0.15 | 0.01 | 0.01 | 0.15 |
| Sample 16 | 0.82 | 0.15 | 0.03 | 0.04 | 0.15 |
| Sample 17 | 0.80 | 0.15 | 0.05 | 0.06 | 0.15 |
| Sample 18 | 0.75 | 0.15 | 0.10 | 0.12 | 0.15 |
| Sample 19 | 0.79 | 0.20 | 0.01 | 0.01 | 0.20 |
| Sample 20 | 0.77 | 0.20 | 0.03 | 0.04 | 0.20 |
| Sample 21 | 0.75 | 0.20 | 0.05 | 0.06 | 0.20 |
| Sample 22 | 0.70 | 0.20 | 0.10 | 0.13 | 0.20 |

Test Example 1

Figure 10A:
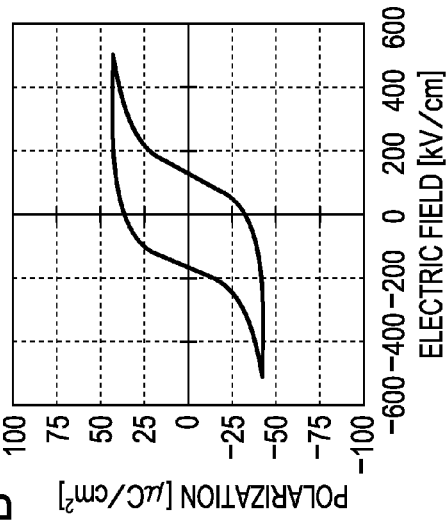
FIGS. 10A to 10D are views illustrating the P-E curve of samples 1 to 4.
Figure 10B:
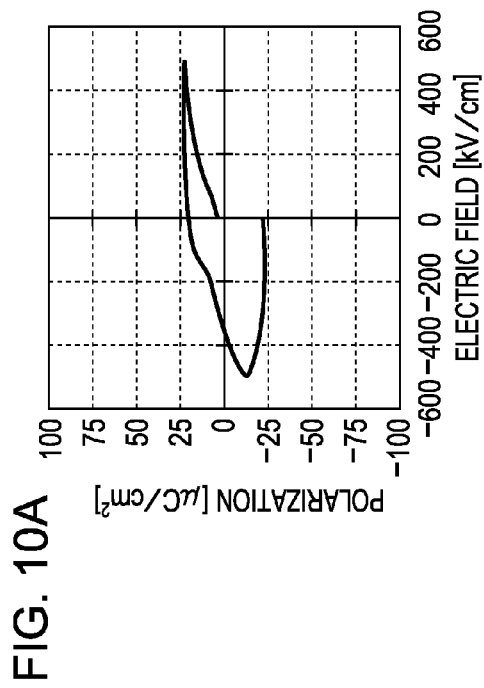
Figure 10C:
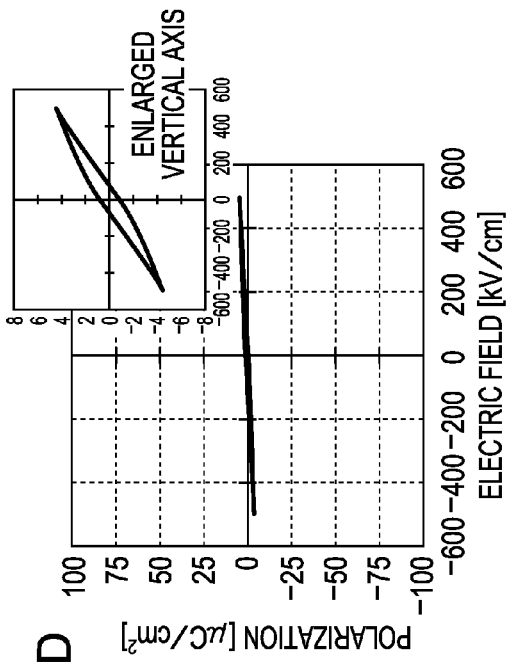
Figure 10D:
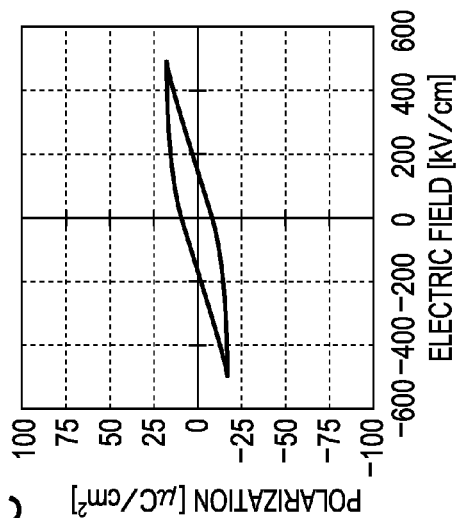

Each of the piezoelectric elements of the samples 1 to 4 was determined for the relationship (P-E curve) between the polarization and electric fields by applying a triangular wave having a frequency of 1 kHz at room temperature using a $\phi=400$ μm electrode pattern by "FCE-1A" manufactured by TOYO Corp. The results of the sample 4 (Comparative Example) are illustrated in FIG. 10A, the results of the sample 1 are illustrated in FIG. 10B, the results of the sample 2 are illustrated in FIG. 10C, and the results of the sample 3 are illustrated in FIG. 10D. As a result, as illustrated in FIGS. 10A to 10D, the samples 2 to 4 containing Bi, Fe, and Ce were ferroelectrics. In contrast, the sample 4 (Comparative Example) which is bismuth ferrate and does not contain Ce did not exhibit a favorable hysteresis.

Test Example 2

Figure 11:
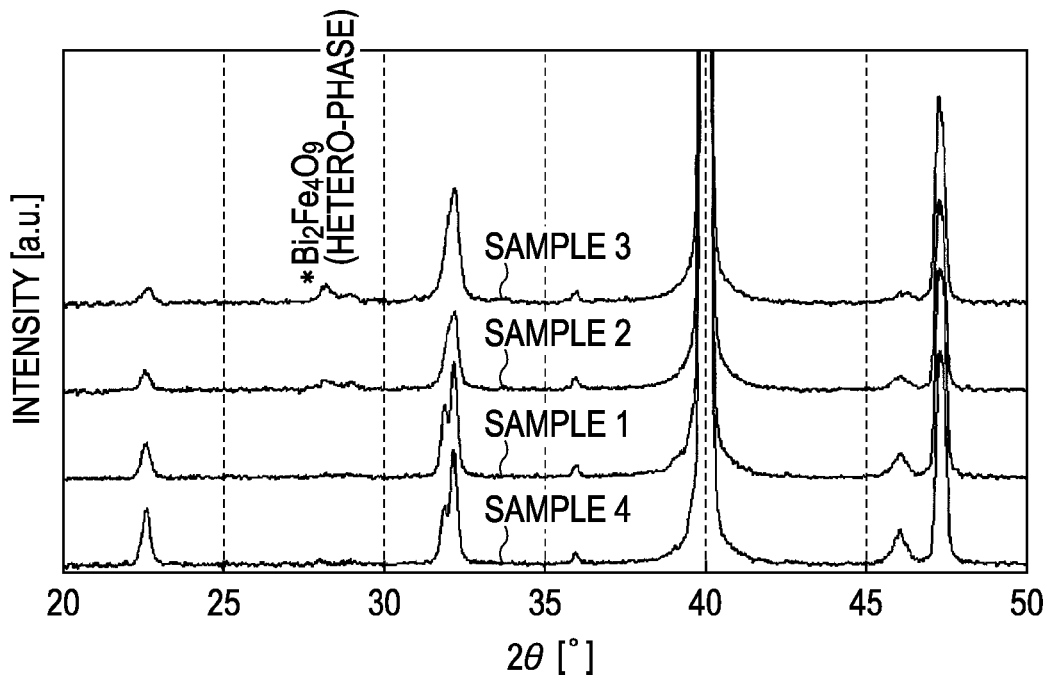
FIG. 11 is a diagram illustrating the X ray diffraction pattern of the samples 1 to 4.

The piezoelectric elements of the samples 1 to 4 were determined at room temperature for the powder X-ray diffraction pattern of the piezoelectric layer using "D8 Discover" manufactured by Bruker AXS using a CuKα line as the X-ray source. The X ray diffraction patterns showing the correlation between the diffraction intensity–diffraction angle 2θ are illustrated in FIG. 11. As illustrated in FIG. 11, the peak derived from the $ABO_3$ type structure and the peak derived from the substrate were observed in all the samples 1 to 4. In addition, as illustrated in FIG. 11, a $Bi_2Fe_4O_9$ heterophase was observed in the samples 1 to 4.

Test Example 3

Figure 12:
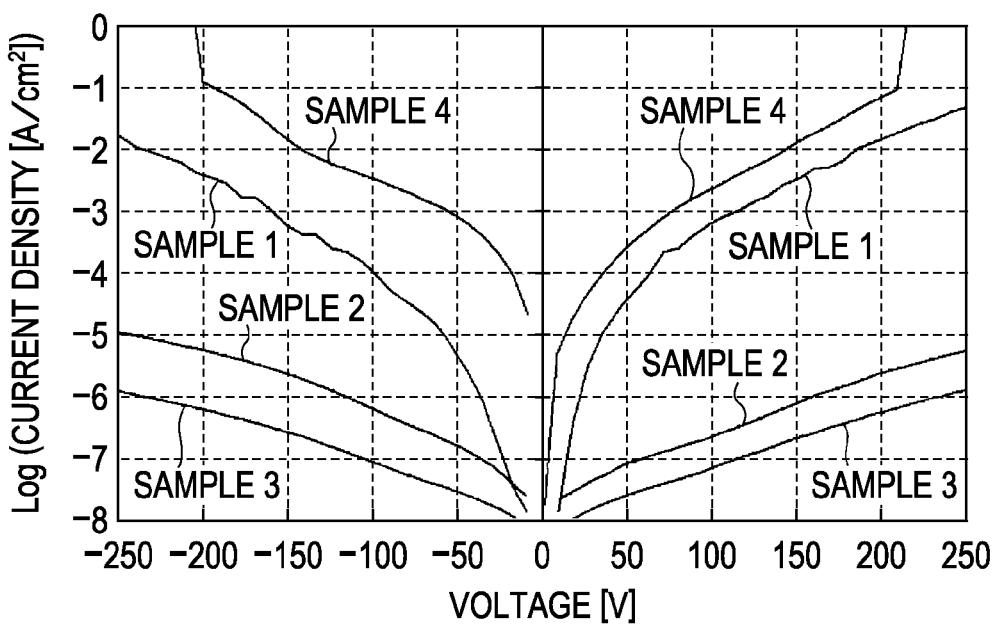
FIG. 12 is a diagram illustrating the J-E Curve of the samples 1 to 4.

Each of the piezoelectric elements of samples 1 to 4 was measured for the J-E Curve at room temperature using "4140B" manufactured by Hewlett Packard Co. The results are illustrated in FIG. 12. In addition, as illustrated in FIG. 12, the samples 1 to 3 containing Ce exhibited more favorable insulation properties than those of the sample 4 (Comparative Example) not containing Ce.

Test Example 4

Figure 13:
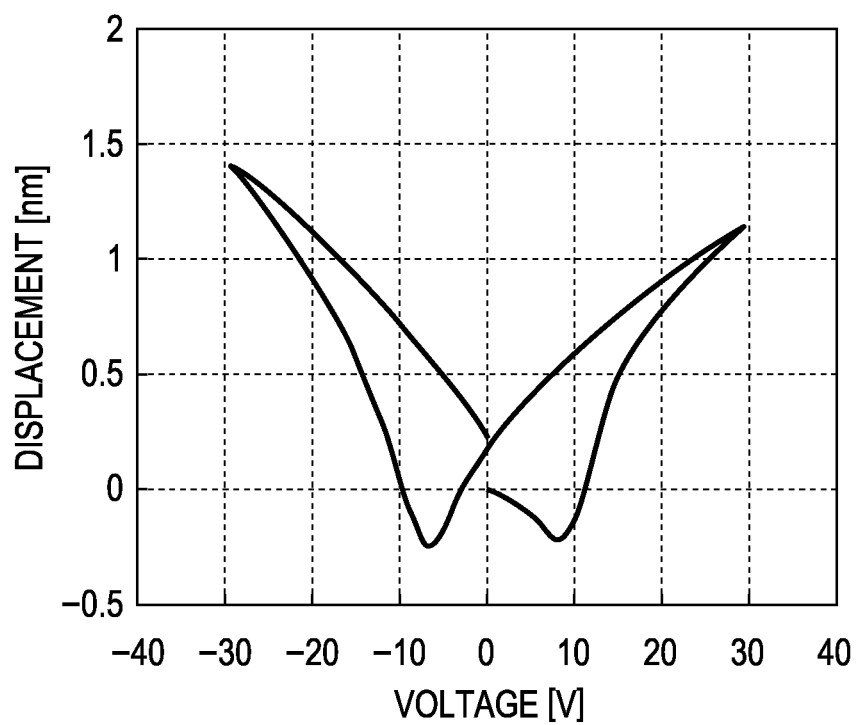
FIG. 13 is a diagram illustrating the S-V curve of the sample 1.

The piezoelectric elements of the samples 1 to 3 were determined at room temperature for the relationship of the electric field-induced distortion–the electric field intensity by applying a voltage having a frequency of 1 kHz using a displacement measuring device (DBLI) manufactured by aix-ACCT GmbH and using a θ=500 μm electrode pattern. The results confirmed that the samples 1 to 3 were displaced. As one example of the results, the results of the sample 1 are illustrated in FIG. 13.

Test Example 5

Figure 14A:
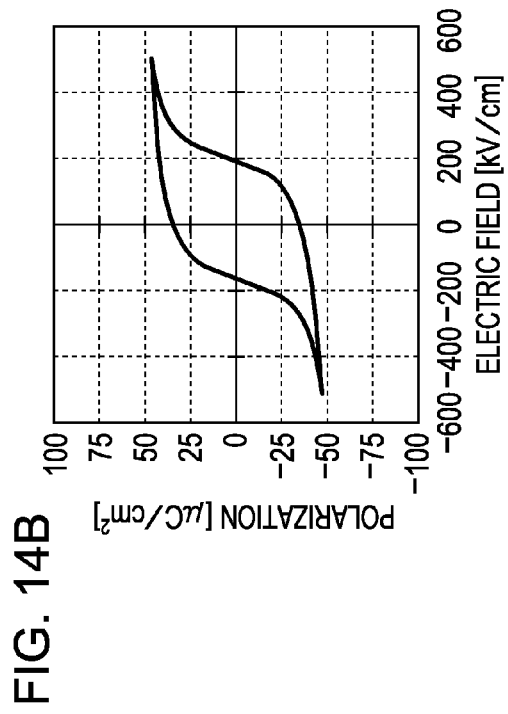
FIGS. 14A to 14D are diagrams illustrating the P-E curve of the samples 6, 11, 17, and 21.
Figure 14B:
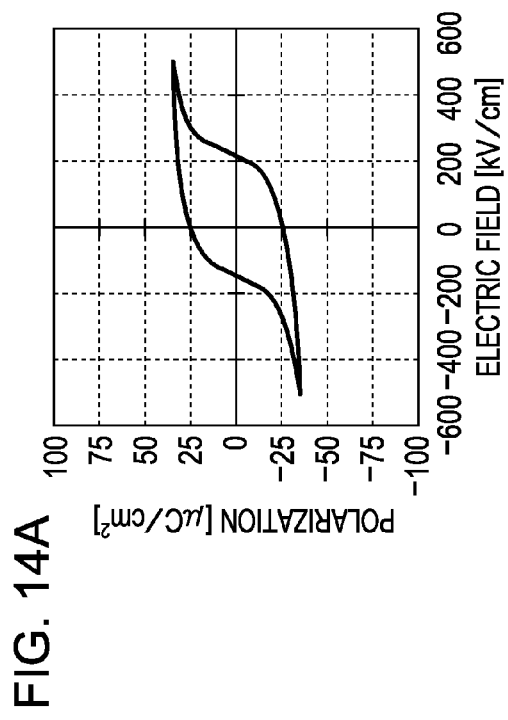
Figure 14C:
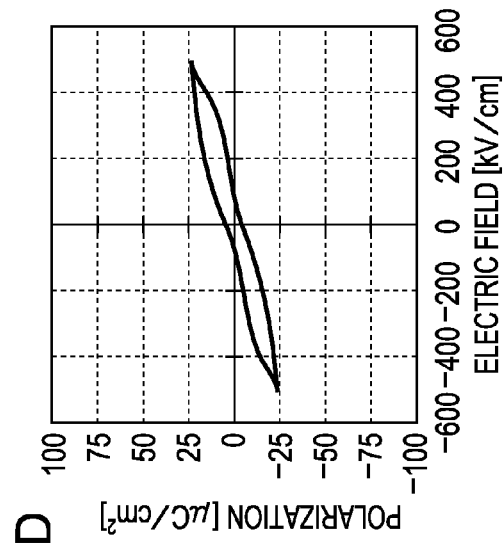
Figure 14D:
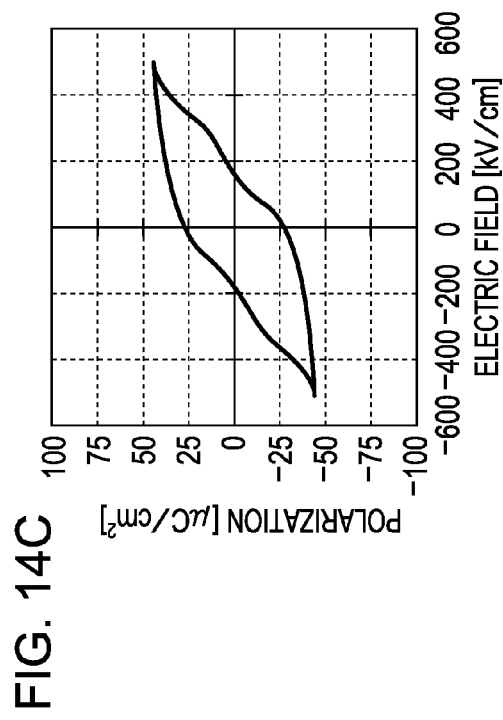

Each of the piezoelectric elements of the samples 5 to 22 was determined for the relationship (P-E curve) of the polarization and the electric fields in the same manner as in Test Example 1. As one example of the results, the results of the sample 6 are illustrated in FIG. 14A, the results of the sample 11 are illustrated in FIG. 14B, the results of the sample 17 are illustrated in FIG. 14C, and the results of the sample 21 are illustrated in FIG. 14D. As illustrated in FIGS. 14A to 14D, the samples 6 and 11 were ferroelectrics and the samples 17 and 21 were antiferroelectrics.

Test Example 6

Figure 15:
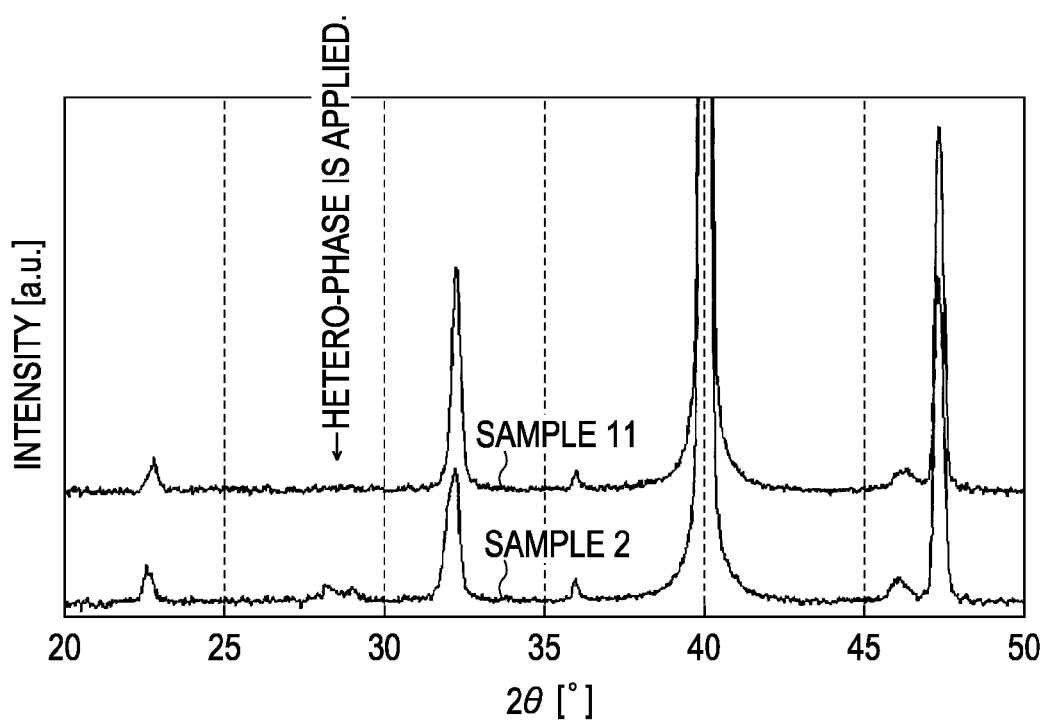
FIG. 15 is a diagram illustrating the X ray diffraction pattern of the samples 2 and 11.

The piezoelectric elements of the samples 5 to 22 were determined for the powder X-ray diffraction pattern of the piezoelectric layer at room temperature using "D8 Discover"

manufactured by Bruker AXS and using a CuKα line as the X-ray source. As one example of the results, the results of the sample 11 are illustrated with the results of the sample 2 in FIG. 15. The results of the samples 6, 11, and 17 are illustrated in FIGS. 16A and 16B. FIG. 16B is an enlarged view of the principal portion of FIG. 16A.

As a result, the peak derived from the $ABO_3$ type structure and the peak derived from the substrate were observed in all the samples 5 to 22 but the $Bi_2Fe_4O_9$ hetero-phase observed in the samples 1 to 4 was suppressed.

In the sample 6, the diffraction peak belonging to a phase (ferroelectric phase) exhibiting ferroelectricity was observed near 2θ=46° as indicated by the arrow α in FIG. 16B. In the sample 17, the diffraction peak belonging to a phase (antiferroelectric phase) exhibiting antiferroelectricity was observed near 2θ=46.5° C. as indicated by the arrow β in FIG. 16B. In the sample 11, both the diffraction peak belonging to the ferroelectric phase and the diffraction peak belonging to the antiferroelectric phase were observed. This confirmed that the sample 17 was an antiferroelectric and the samples 6 and 11 are ferroelectrics. The sample 11 exhibited the Morphotropic phase boundary (M. P. B.) of the antiferroelectric phase and the ferroelectric phase.

FIG. 17 illustrates a diagram in which the results of analyzing each of the samples 1 to 22 to determine whether the samples were antiferroelectrics or ferroelectrics and further whether or not the samples were ferroelectrics exhibiting the Morphotropic phase boundary from the X ray diffraction patterns are plotted against the composition ratio of La and Ce. As illustrated in FIG. 17, it was clarified that the piezoelectric elements can become ferroelectrics or antiferroelectrics exhibiting an electric field-induced phase transition depending on the La addition amount or the like.

Test Example 7

Figure 18A:
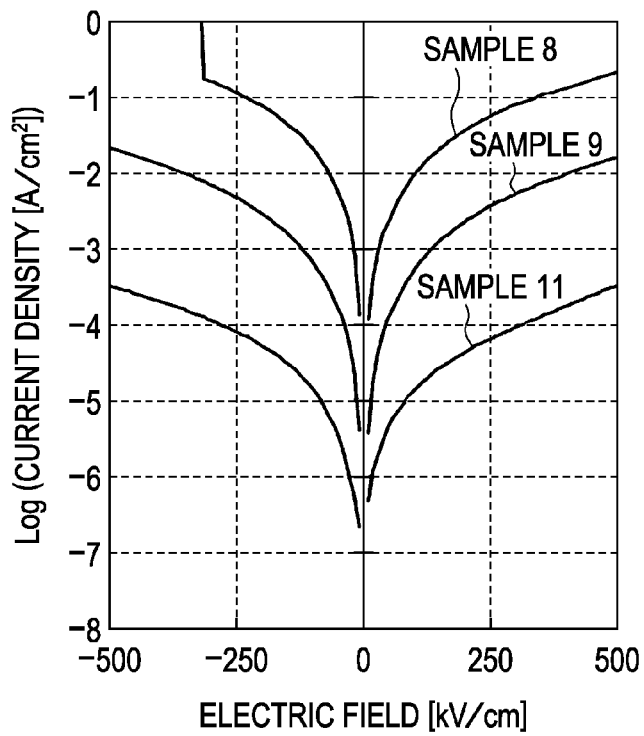
FIGS. 18A to 18B are diagrams illustrating the measurement results of the J-E Curve.
Figure 18B:
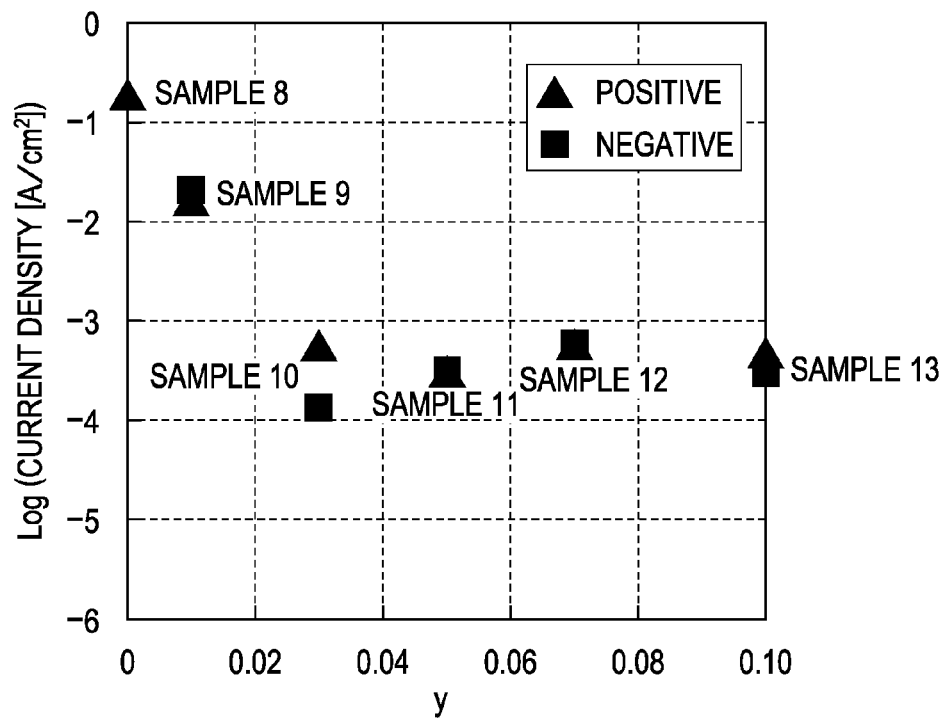

Each of the piezoelectric elements of the samples 5 to 22 was measured for the J-E Curve by the same method as in Test Example 3. One example of the results is illustrated in FIGS. 18A and 18B. FIG. 18B is a diagram in which the values at 500 kVcm$^{-1}$ were plotted against the composition ratio of Ce. The results confirmed that, even in the case of the piezoelectric material to which La was further added, the effects of increasing the insulation properties to a high degree and suppressing a leakage current obtained by the Ce addition shown in Test Example 3 above can be maintained as illustrated in FIG. 18.

Test Example 8

Figure 19A:
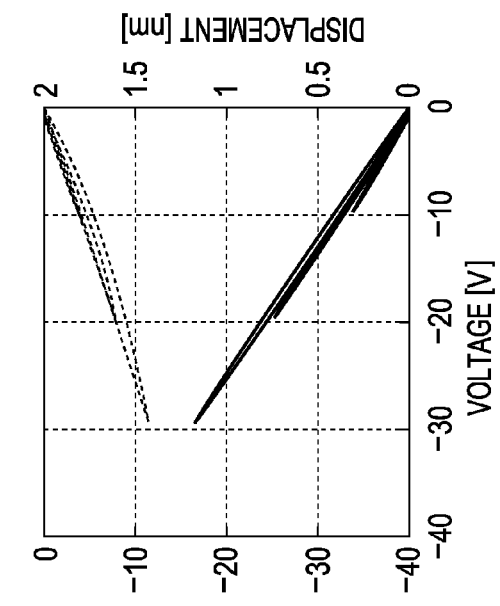
FIGS. 19A to 19D are diagrams illustrating the S-V curve of the samples 6, 11, 17, and 21.
Figure 19B:
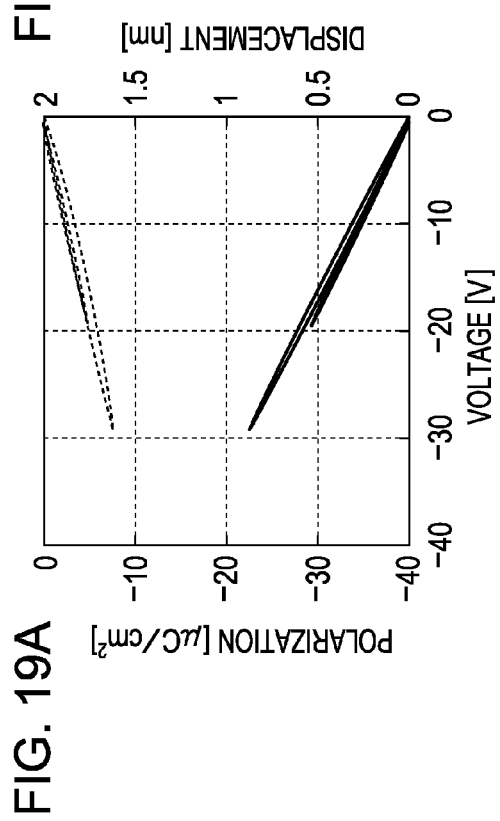
Figure 19C:
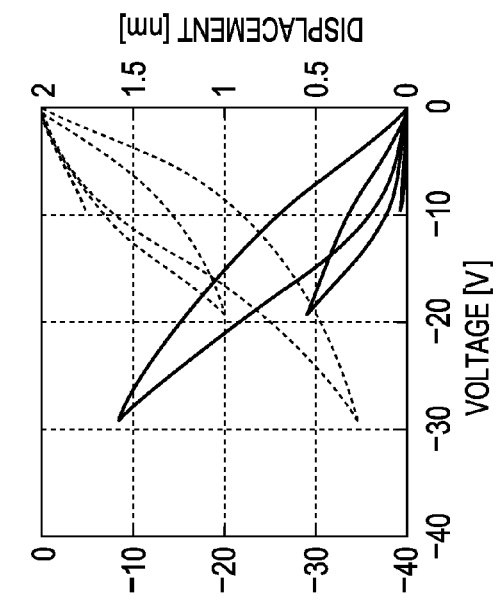
Figure 19D:
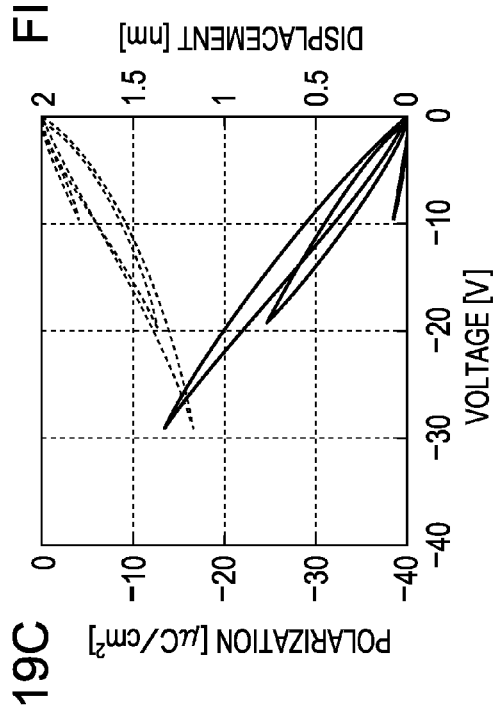

The piezoelectric elements of the samples 5 to 22 were determined for the relationship of the electric field-induced distortion and the voltage at room temperature by applying a voltage having a frequency of 1 kHz using a displacement measuring device (DBLI) manufactured by aixACCT GmbH and using a φ=500 μm electrode pattern. As one example of the results, the results of the sample 6 are illustrated in FIG. 19A, the results of the sample 11 are illustrated in FIG. 19B, the results of the sample 17 are illustrated in FIG. 19C, and the results of the sample 21 are illustrated in FIG. 19D. In FIGS. 19A to 19D, the dotted line represents the polarization and the solid line represents the displacement. As a result, the displacement level of the sample 17 and the sample 21 which are antiferroelectrics was high as illustrated in FIGS. 19A to 19D. The displacement of the sample 11 which exhibits the Morphotropic phase boundary was higher than that of the sample 6 which is a ferroelectric.

OTHER EMBODIMENTS

As described above, one embodiment of the invention is described but the fundamental structure of the invention is not limited to the above-described embodiments. For example, the silicon single crystal substrate is mentioned as an example of the flow path forming substrate 10 in the embodiments described above but, without particularly being limited thereto, materials, such as an SOI substrate and glass, may be used.

In the embodiments described above, the piezoelectric element 300 in which the first electrode 60, the piezoelectric layer 70, and the second electrode 80 are successively laminated on the substrate (flow path forming substrate 10) is mentioned as an example but the invention is not particularly limited thereto and can also be applied to a longitudinal vibration type piezoelectric element in which a piezoelectric material and an electrode formation material are alternately laminated and which expands and contracts in the axial direction.

Figure 20:
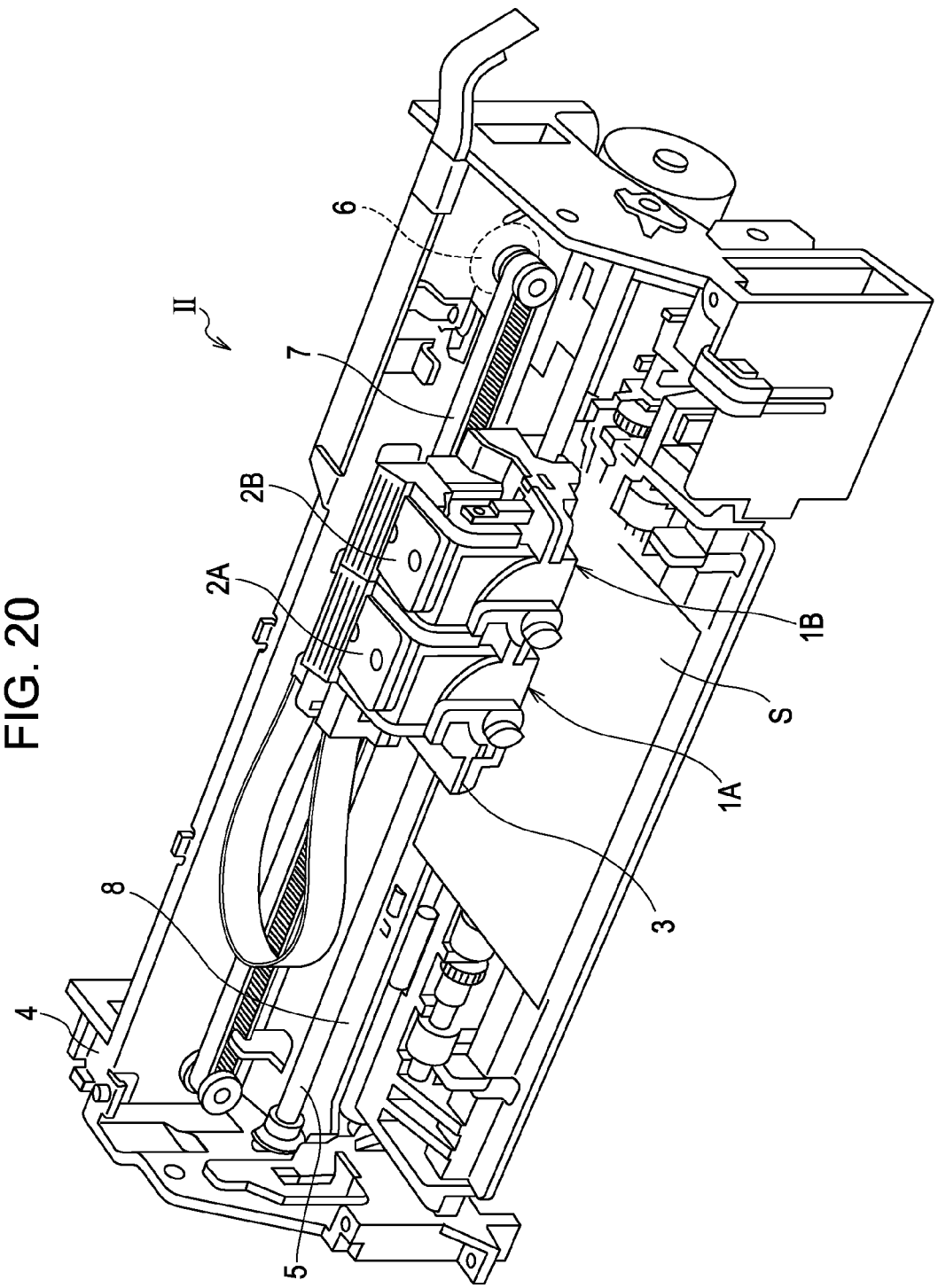
FIG. 20 is a view schematically illustrating the structure of a recording device according to one embodiment of the invention.

Each of the ink jet recording heads of these embodiments constitutes a part of a recording head unit having an ink flow path communicating with an ink cartridge or the like and is mounted on the ink jet recording device. FIG. 20 is a schematic view illustrating one example of the ink jet recording device.

In an ink jet recording device II illustrated in FIG. 20, cartridges 2A and 2B constituting an ink supply member are detachably provided to recording head units 1A and 1B having the ink jet recording heads and a carriage 3 carrying the recording head units 1A and 1B is provided to a carriage axis 5 attached to a device body 4 in such a manner as to freely move in the axial direction. The recording head units 1A and 1B discharge a black ink composition and a color ink composition, respectively, for example.

The carriage 3 carrying the recording head units 1A and 1B is moved along the carriage axis 5 by transmission of a driving force of a drive motor 6 to the carriage 3 through two or more gears (not illustrated) and a timing belt 7. A platen 8 is provided to the device body 4 along the carriage axis 5, so that a recording sheet S which is a recording medium, such as paper, which is fed by a feed roller (not illustrated) or the like, is wound around the platen 8 and conveyed.

In the embodiments described above, the description is directed to the case where the ink jet recording head is taken as an example of the liquid ejection head. However, the invention is widely directed to general liquid ejection heads and it is a matter of course that the invention can also be applied to liquid ejection heads that ejects liquid other than ink. Examples of other liquid ejection heads include various kinds of recording heads for use in image recording devices, such as a printer, color material ejection heads for use in manufacturing color filters of liquid crystal displays and the like, electrode material ejection heads for use in forming electrodes of an organic EL display, FED (field emission display), and the like, and bioorganic material ejection heads for use in manufacturing bio chips.

The invention is not limited to the piezoelectric elements to be mounted on the liquid ejection heads typified by the ink jet recording head and can also be applied to piezoelectric elements to be mounted on other devices, such as: ultrasonic devices, such as an ultrasonic transmitter, ultrasonic motors, pressure sensors, piezoelectric pumps, and vibration power generation devices that convert a mechanical vibration into electrical power. The invention can also be similarly applied to pyroelectric elements, such as an IR sensor, and ferroelectric elements, such as a ferroelectric memory.

What is claimed is:

1. A liquid ejection head, comprising:
a pressure generation chamber communicating with a nozzle opening; and
a piezoelectric element having a piezoelectric layer between electrodes,
wherein the piezoelectric layer is a $ABO_3$ perovskite type complex oxide containing bismuth, iron, and cerium, the cerium exists in the A site, and the piezoelectric layer contains the cerium in a proportion of 0.01 molar ratio or more and 0.13 molar ratio or lower based on the total amount of the bismuth and the cerium.

2. The liquid ejection head according to claim 1, wherein the piezoelectric layer further contains lanthanum.

3. The liquid ejection head according to claim 2, wherein the piezoelectric layer contains the lanthanum in a proportion of 0.05 molar ratio or more and 0.20 molar ratio or lower based on the total amount of the bismuth, the cerium, and the lanthanum.

4. The liquid ejection head according to claim 2, wherein the piezoelectric layer exhibits an electric field-induced phase transition.

5. The liquid ejection head according to claim 2, wherein the piezoelectric layer is a ferroelectric.

6. The liquid ejection head according to claim 1, wherein, in the piezoelectric layer, a diffraction peak belonging to a phase exhibiting ferroelectricity and a diffraction peak belonging to a phase exhibiting antiferroelectricity are simultaneously observed in a powder X-ray diffraction pattern.

* * * * *